United States Patent [19]

Parrish

[11] Patent Number: 5,039,879

[45] Date of Patent: Aug. 13, 1991

[54] DIGITALLY PROGRAMMABLE GAIN NORMALIZATION CIRCUIT

[75] Inventor: William J. Parrish, Goleta, Calif.

[73] Assignee: Grumman Aerospace Corp., Bethpage, N.Y.

[21] Appl. No.: 473,835

[22] Filed: Feb. 2, 1990

[51] Int. Cl.$^5$ .............................................. G11C 27/02
[52] U.S. Cl. .................................... 307/353; 307/264; 307/493
[58] Field of Search ................ 307/353, 264, 493, 311

[56] References Cited

U.S. PATENT DOCUMENTS 4,633,086 12/1986 Parrish .................................. 250/338
4,786,831 11/1988 Morse et al. ......................... 307/353
4,804,863 2/1989 Welland et al. ...................... 307/353
4,914,319 4/1990 Hashimoto ........................... 307/353

Primary Examiner—John Zazworsky
Attorney, Agent, or Firm—Stetina and Brunda

[57] ABSTRACT

A digitally programmable gain normalization circuit for normalizing gains among analog signal channels. The gain normalization circuit is comprised of a charge integrator which has a plurality of capacitors to provide selectible capacitance values which determine the gain of a differential amplifier/sample and hold circuit. A programmable gain control register selects the charge integrator capacitance value. Both static and dynamic latches are disclosed for selecting the capacitors to be utilized in the charge integrator.

16 Claims, 2 Drawing Sheets

DIGITALLY PROGRAMMABLE GAIN NORMALIZATION CIRCUIT

FIELD OF THE INVENTION

The present invention relates generally to electronic signal processing and more specifically to a digitally programmable gain normalization circuit for normalizing gains among analog signal channels in an infrared detection system. The gain normalization circuit is comprised of a charge integrator which has a plurality of capacitors to provide selectable capacitance values which determine the gain of a differential amplifier/sample and hold circuit. A programmable gain control register selects the charge integrator stage capacitance value.

BACKGROUND OF THE INVENTION

Current infrared detection systems incorporate arrays of large numbers of discrete, highly sensitive detector elements, the outputs of which are connected to sophisticated processing circuitry. By rapidly analyzing the pattern and sequence of detector element excitations, the processing circuitry can identify and monitor sources of infrared radiation.

A contemporary subarray of detectors may contain 256 detectors on a side, or a total of 65,536 detectors. The size of each square detector is approximately 0.009 centimeters on a side with 0.00127 centimeter spacing between detectors. Such a subarray would therefore be 2.601 centimeters on a side. The subarray may, in turn, be joined to form an array that connects twenty-five million or more detectors. Considerable difficulties are presented in normalizing the output of each detector.

The response of an infrared detector and its associated electronic processing channel is linear with an output in volts per watt of absorbed infrared radiation. A DC offset is associated with each detector and signal processing channel and is defined as fixed pattern noise. The detector response and DC offset are unique for each channel, i.e. they are different for each channel but fall within a given range of values. Satisfactory methods exist to eliminate fixed pattern noise, however the removal of variations in channel response, or gain, among elements within an array is typically accomplished with a separate specialized computer.

Gain normalization to a high level is required by the sophisticated algorithms which analyze the detector array outputs. The variation in gain from one detector channel to another increases the dynamic range requirements for the output amplifier when detector channels are multiplexed into a common output amplifier. The dynamic range of the analog-to-digital converter and the signal processing hardware must likewise have sufficient dynamic range to handle the multiplexed data. Increasing the dynamic range requirements of the output amplifier, analog-to-digital converter, and signal processing hardware results in an increase in system weight and cost. Therefore, it is desirable to maintain the best possible uniformity in gain among all detector channels. Gain normalization commonly consists of multiplication of the signal by a correction factor after analog to digital conversion. This is commonly accomplished with a separate specialized computer which is required to have sufficient memory to store a correction factor for each channel and must also have dedicated multiplication hardware. The memory and power requirements become severe for a five million or more element detector array.

The use of such a specialized computer to perform gain normalization also increases the size and weight of the detector system. This is particularly crucial in spacecraft applications where weight, volume, and power considerations are paramount.

As such, although the prior art has recognized the need for gain normalization for infrared detector arrays, the proposed solutions have to date been ineffective in providing a satisfactory remedy.

SUMMARY OF THE INVENTION

The present invention comprises a digitally programmable gain normalization circuit for normalizing gains among the analog signal channels of an infrared detector array. The gain normalization circuit is comprised of a charge integrator which has a plurality of capacitors to provide selectable capacitance values which determine the gain of a differential amplifier/sample and hold circuit. A programmable gain control register selects the charge integrator capacitance value. Either static or dynamic latches can be used for selecting the capacitors to be utilized in the charge integrator.

These, as well as other future objects and advantages will be more apparent from the following description and drawings. It is understood that changes in the specific structure shown and described may be made within the scope of the claims without departing from the spirit of the invention.

DETAILED DESCRIPTION OF THE PREFERRED EMBODIMENTS

The detailed description set forth below in connection with the appended drawings is intended as a description of the presently preferred embodiments of the invention, and is not intended to represent the only forms in which the present invention may be constructed or utilized. The description sets forth the functions and sequence of steps for constructing and operating the invention in connection with the illustrated embodiments. It is understood however, that the same or equivalent function and sequences may be accomplished by different embodiments that are also intended to be encompassed by the spirit and scope of the invention.

The digitally programmable gain normalization circuit of the present invention is illustrated in FIGS. 1-6 which depict two presently preferred embodiments of the invention.

Figure 1:
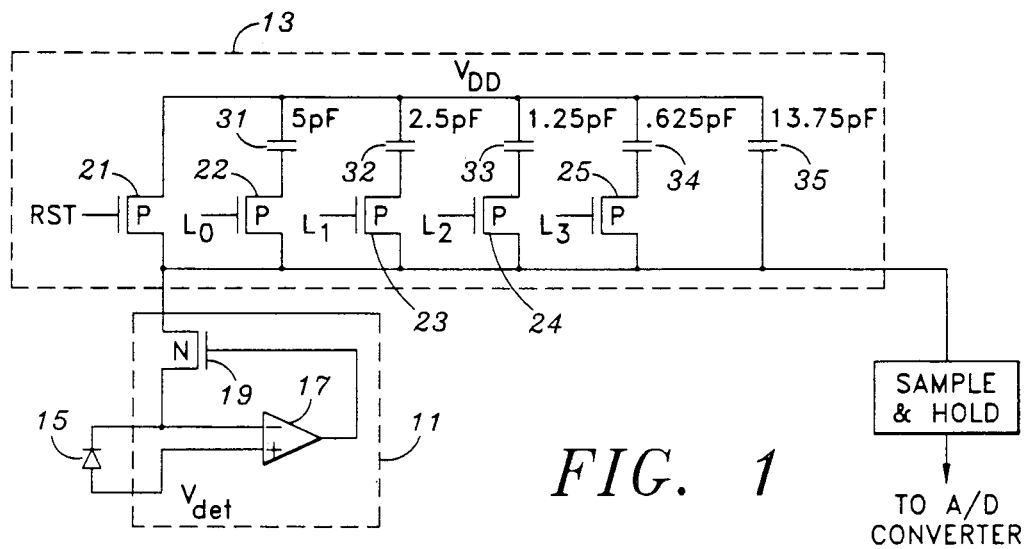
FIG. 1 is an electrical schematic of the charge integrator and operational amplifier.

Referring now to FIG. 1, the digitally programmable gain normalization circuit is comprised of an input differential amplifier circuit 11 and a charge integrator 13.

An infrared detector 15 provides an input signal to a differential amplifier 17. The infrared detector 15 is typically a photovoltaic detector formed using materials such as, mercury cadmium telluride (HgCdTe) in accordance with techniques well known to those skilled in the art. Other detectors may be utilized in accordance with the particular detection function to be performed.

The cathode of the infrared detector 15 is connected to the source of an N-channel depletion mode FET 19 and the negative terminal of the differential amplifier 17. The anode of the detector 15 is connected to the positive terminal of the differential amplifier 17 which is at a reference voltage level $V_{det}$. The output of the differential amplifier 17 is connected to the gate of the FET 19. The drain of the FET 19 is connected to the charge integrator 13 and also to a sample and hold (not shown).

The input amplifier circuit 11 is an auto-zero biasing circuit that detects an output from the detector 15 on the negative (−) terminal of amplifier 17 and communicates a signal to the gate of FET 19 in response to the detected signal. The signal on the gate of FET 19 will, in turn, vary the conductance of FET 19 so as to permit current flow through FET 19 to restore the negative terminal of amplifier 17 to level $V_{det}$. Thus, the voltage potential across detector 15 remains at approximately zero. As the conductance of FET 19 is varied to compensate for the signal from detector 15, the voltage on the drain of FET 19 is reduced from its initial level. That reduced level is communicated to capacitors 31 through 35, and the capacitor of the sample and hold circuit, not shown.

The principal feature of the input differential amplifier circuit 11 is to compensate for component and biasing tolerances within the amplifier circuit such that the current regulating FET 19 remains independent of those tolerances. A further description of the operation of the input amplifier circuit of FIG. 1 is provided in applicant's issued U.S. Pat. No. 4,633,086.

The charge integrator 13 is comprised of FETs 2 through 25 and capacitors 31 through 35. Each of the capacitors 31 through 35 can be connected in parallel with any of the other capacitors 31 through 35 by activating the appropriate FETs 22 through 25. Capacitor 35 will always be in the integrator circuit and determines the maximum gain of the gain normalization circuit as described below.

Figure 2:
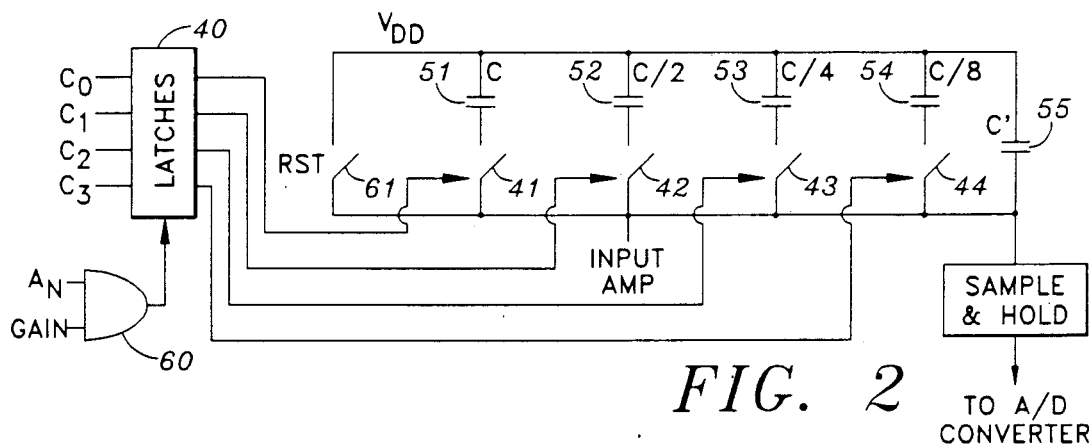
FIG. 2 is an electrical block diagram which illustrates the function of the latch to selectively add capacitors to the charge integrator.

Ideally capacitors 31 through 35 will have capacitances in the ratios of C, C/2, C/4, C/8, and C' as shown in FIG. 2. In the preferred embodiment the capacitors 31 through 35 have values of 5pF, 2.5pF, 1.25pF, 0.625pF, and 13.75pF respectively. This variation from the ideal ratios compensates for the specific inherent capacitances and electrical characteristics of the circuit of the preferred embodiment.

FET 21 serves as a reset switch, shorting out any of capacitors 31 through 35 which are active in the integrator upon receipt of a reset signal.

The output of the charge integrator, which is the amplified infrared detector signal, is connected to sample and hold circuitry for analog to digital conversion. As is common in the art, the sample and hold circuitry has a capacitor which is charged by the amplified detector signal. Once charged, the capacitor of the sample and hold circuit is disconnected from the input signal so that analog to digital conversion of the sampled signal can be accomplished.

The charge integrator 13 of the present invention provides a second capacitance which is in parallel with the capacitor of the sample and hold circuitry. Therefore, the detector output is split between the capacitors of the charge integrator and the capacitor of the sample and hold circuit. By splitting the detector output between the capacitors of the charge integrator and the capacitor of the sample and hold, the charge generated by the detector circuit or input differential amplifier circuit 11 (that is, the current resulting from such charge) is shared by the charge integrator 13 and the sample and hold such that the charge is affectively split therebetween. Thus, the detector 15 generates a charge, causing current to flow to the charge integrator 13 and sample and hold, which are connected in parallel, such that the current results in charges being developed on the capacitors of the charge integrator 13 and the capacitor of the sample and hold wherein the sum of the charges developed upon the capacitors of the charge integrator 13 and the capacitor of the sample and hold is substantially equal to the current generated by the input differential amplifier circuit 11. Thus, the sample and hold circuit is electrically connected in parallel to the charge integrator 13 of the gain normalization circuit so as to share the charge provided by the detector circuit or input differential amplifier circuit 11. The ratio of the total value of the capacitance of the charge integrator to the capacitance of the sample and hold circuit determines the proportion of the detector output which will be stored on the sample and hold capacitor. Therefore the amount of charge stored on the capacitor of the sample and hold circuit for any given detector output, is determined by the capacitance of the charge integrator. Since the capacitance of the charge integrator is variable, the charge integrator serves as a variable gain control for its associated infrared detector channel.

By selectively adding capacitors to the charge integrator, the total capacitance of the charge integrator may be varied. The addition of capacitors to the charge integrator is controlled by an external gain register which may be part of an external controller and may be programmably controlled. The gain control register outputs a GAIN signal which is representative of the desired infrared detector channel gain. The GAIN signal output by the gain control register is a single positive pulse timed to enable the latches to which it is issued when the counter signals $C_0$ through $C_3$ define the desired gain and are present on the latches. This is more thoroughly discussed in reference to FIG. 6 below.

Referring now to FIG. 2 which depicts the charge integrator conceptually, latches 40 control switches 41, 42, 43 and 44 which in the preferred embodiment are the P-channel depletion mode FET's 22-25 of FIG. 1. The switches 41-44 of FIG. 2 permit the selective addition of capacitors 51-54 into the charge integrator. The ratio of the values of the capacitors 51-55 are C, C/2, C/4, C/8 and C'. The use of such ratios permits the widest possible variation in total capacitance for a given number of selectable capacitors, therefore providing the greatest possible range of gains. An AND gate 60 enables the latches 40 such that the latches 40 only operate to select the capacitors 51 through 54 of the charge integrator when both a GAIN signal and an enable signal $A_N$ are present.

A reset switch 61 which corresponds to the reset FET 21 of FIG. 1 discharges any capacitors which have been added to the charge integrator section to permit a new selection of capacitors for determining a new gain value.

Two preferred embodiments of the present invention are disclosed. The two embodiments differ only in the type of latches used to add capacitors to the charge integrator. The first embodiment utilizes dynamic latches and the second embodiment utilizes static latches.

Figure 4:
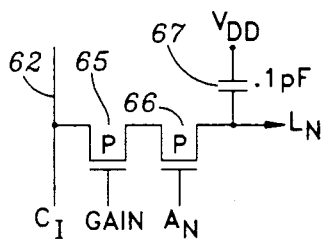
FIG. 4 is an electrical schematic of a dynamic latch.

Referring now to FIG. 4 the dynamic latch of the first embodiment is depicted. This latch is referred to as a dynamic latch because the state of the FET to which it is attached is determined by a decaying change on a capacitor. The use of a capacitor in the dynamic latch is possible as long as the system is operated at low temperatures since leakage currents at low temperatures are extremely low. Four such latches, corresponding to the four FETS 22-25 of FIG. 1, are used in the present invention. However, it will be understood by those skilled in the art that any number of latches, FETS, and capacitors may be used in the charge integrator depending upon the resolution and range over which capacitance values, and therefore gains, are desired.

Each of the four dynamic latches is connected to one of the counter buses $C_0$ through $C_3$ via input 62. P-channel depletion mode FETs 65 and 66 are connected in series with capacitor 67 such that the counter is only applied to capacitor 67 when both GAIN for FET 65 and $A_N$ for FET 66 are in a high state. The charge accumulated on capacitor 67 is applied to the respective FET at $L_N$, i.e. $L_0$, $L_1$, $L_2$, or $L_3$ of FIG. 1, causing that FET to conduct and thereby add its associated capacitor 31, 32, 33 or 34 to the charge integrator.

Figure 5:
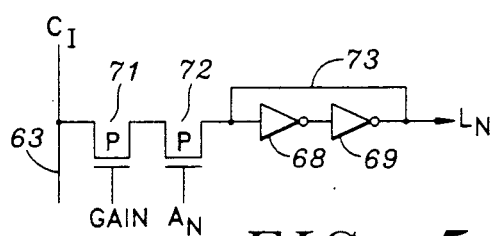
FIG. 5 is an electrical schematic of a static latch.

Referring now to FIG. 5, a static latch using two inverters 68 and 69 is depicted. As with the dynamic latch of FIG. 4, each of the four static latches is connected to one of the counter buses $C_o$ through $C_3$ via input 63. P-channel depletion mode FETs 71 and 72 are connected in series with inverters 68 and 69 such that the counter state is only applied to the input of inverter 68 when GAIN for FET 71 and $A_N$ for FET 72 are both in the high state. Application of a high counter state to the input side of inverter 68 results in a low state on the output side of inverter 68 which serves as an input to inverter 69, resulting in a high state on the output of inverter 69. The output of inverter 69 is fed back via electrical connection 73 to the input of inverter 68 thereby maintaining the high state until the system is reset.

Figure 3:
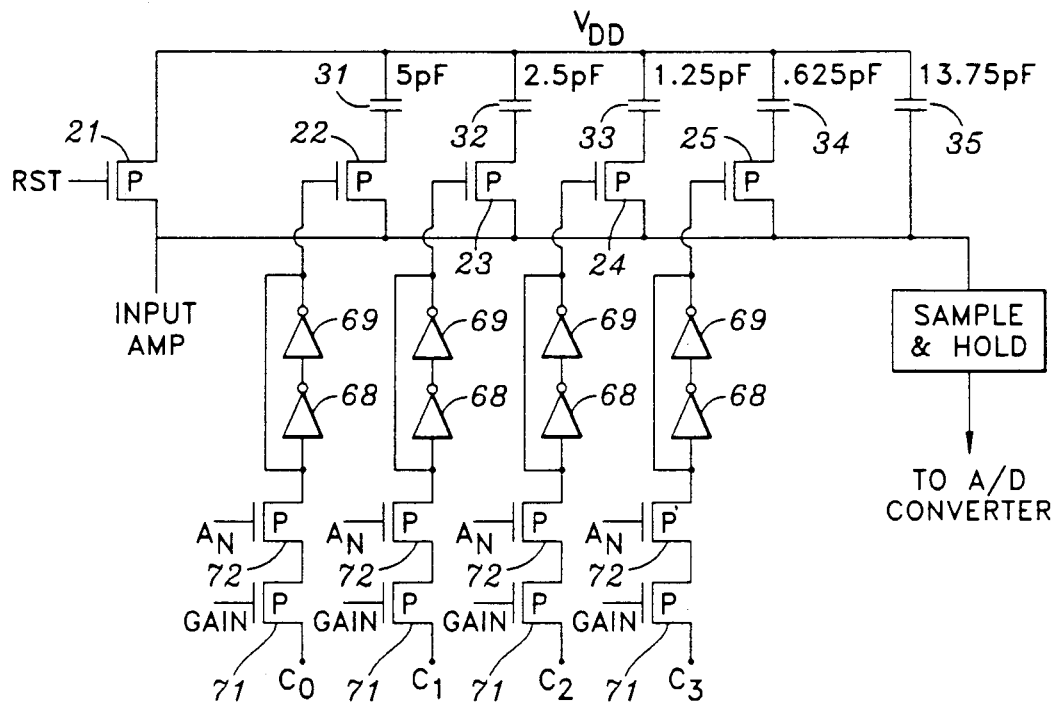
FIG. 3 is an electrical schematic of the charge integrator utilizing static latches.

Referring now to FIG. 3 the charge integrator of the second embodiment is depicted. It has four static latches attached to the FETS 22-25. In the first embodiment, not shown, the four static latches of FIG. 3 would be replaced with four dynamic latches, such as those shown in FIG. 4.

Figure 6:
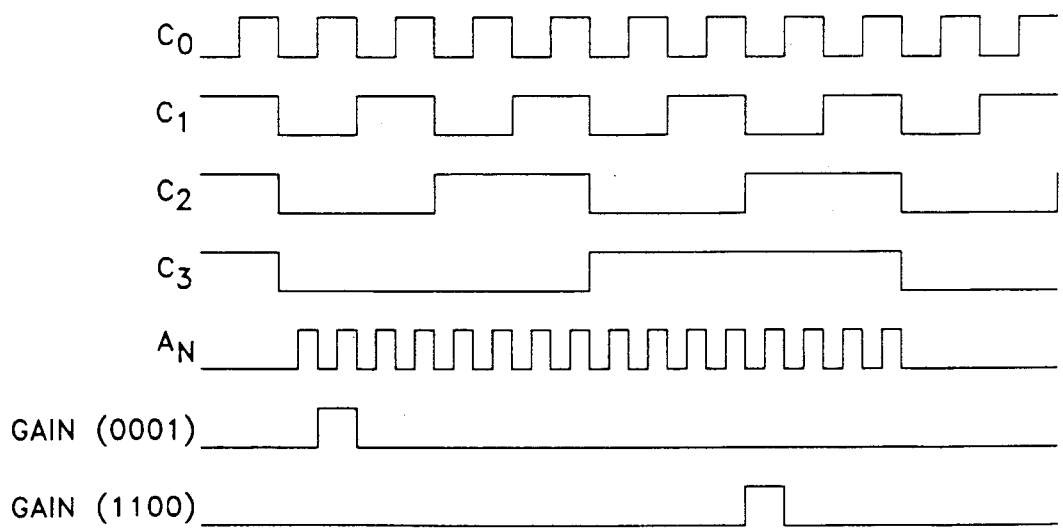
FIG. 6 is a signal waveform diagram showing the required latch inputs to achieve two different sample gains.

Referring now to FIG. 6, the waveforms $C_0$ through $C_3$, $A_N$, GAIN(0001), and GAIN(1100), are depicted. The numbers in parentheses associated with GAIN signal indicate which capacitors in the integrator are to be activated. Only those capacitors 31-34, corresponding to counter signals $C_0$ through $C_3$ which are in a high state when the GAIN signal is output, will be activated. The least significant digit indicates the status of capacitor 31, the next most significant digit indicates the status of capacitor 32, and so on. The three zeros in GAIN(0001) indicate that capacitors 32, 33 and 34 are not activated. The one indicates that capacitor 31 is activated. The two ones in GAIN(1100) indicate that capacitors 33 and 34 are activated. The two zeros indicate that capacitors 31 and 32 are not activated.

As can be seen by referring also to FIG. 3, application of counter signals $C_0$ through $C_3$ to their respective latches will cause all possible states to occur at the inputs to latches $C_0$ through $C_3$. That is, latch inputs representing every possible combination of integrator capacitors will be present at the latches during each read cycle. The desired gain is achieved by only enabling the latches during the time when the states of the counter signals $C_o$ through $C_3$ are present which will result in the desired capacitors being added to the charge integrator. Enabling of the latches is accomplished by applying the GAIN signal to each of the FETS (65 in FIG 4, 71 in FIGS. 3 and 5) during the time in which each of the counter signal states $C_o$ through $C_3$ are such that the correct gain will be achieved. The enable signal $A_N$ is timed such that it transitions from the low to the high state during the middle of the GAIN pulse and the shortest duration counter signal $C_0$, thereby ensuring that the latches are not activated until the GAIN pulse is present and the counter signals $C_0$ through $C_3$ are stabilized. Thus, application of the GAIN signal to the FETS (65 in FIG. 4, 71 in FIGS. 3 and 5) at the appropriate time permits the state of counters $C_0$-$C_3$ at that instant to be applied to the static latches which control FETS 22-25 to regulate the capacitance of the charge integrator 13. This is discussed in further detail below.

The overall operation of the digitally programmable gain normalization circuit of the second embodiment, in conjunction with an infrared detector and a sample and hold circuit, is as follows.

Stored in the detection system's onboard data processor is a number representative of the gain to be applied to each individual infrared detector channel, such that the gain of each infrared detector channel will be normalized to within ±1.5% prior to being input to the sample and hold for analog to digital conversion. Considering now an individual infrared detector channel, a four bit binary number representative of the gain for that channel is stored in a gain control register.

Counter signals $C_0$ through $C_3$, as illustrated in FIG. 6, are continuously applied to the inputs $C_0$ through $C_3$ of the static latches illustrated in FIG. 3. If we assume that the gain required by this particular infrared detector channel will be achieved when only capacitor 31 and capacitor 35 are active in the integrator, then GAIN(0001) will be issued from the gain control register during the read cycle of that particular infrared detector channel. GAIN(0001) is timed such that it occurs when $C_0$ is in the high state and $C_1$ through $C_3$ are all in the low state, as illustrated in FIG. 6. This results in capacitor 3 being added to the charge integrator. Capacitor 35 is always active in the charge integrator. The combined capacitance of capacitor 31 and capacitor 35 is such that the required gain will be achieved.

During approximately the middle of the GAIN(0001) pulse, $A_N$ transitions from the low state to the high state, thereby permitting each of the counter signals $C_0$ through $C_3$ to be applied to the first inverter 68 of each of the latches depicted in FIG. 3. In this example only inverter 68 for the latch corresponding to counter signal $C_0$ will have a high input. This inverter will output a low state which appears as an input to inverter 69 of latch $C_0$, causing inverter 69 to output a high state which activates FET 22. This places capacitor 31 in parallel with capacitor 35 of the integrator.

The output of detector 15 of FIG. 1 will now be split between the integrator 13 and the sample and hold. A portion of the charge generated by detector 15 will be stored upon capacitors 31 and 35 of the charge integrator. The remainder of the charge generated by detector 15 will be stored upon the capacitor of the sample and hold circuit. The amount of charge stored in the sample and hold as opposed to the charge integrator depends upon the ratio of the capacitance of the capacitor in the sample and hold to the capacitance of the charge integrator. The ratio of the charge stored in the sample and hold to the charge stored in the integrator determines the gain of the charge integrator/sample and hold channel. It is understood that the exemplary digitally programmable gain normalization circuit of the present invention described herein and shown in the drawings represents only a presently preferred embodiment of the invention. Indeed, various modifications and additions may be made to such embodiment without departing from the spirit and scope of the invention. For example, the electrical components need not be connected precisely as depicted since the electrically equivalent arrangements are possible. For instance, the FETS and capacitors of the charge integrator could be reversed in position without effecting the function of the circuit. Also, means of switching other than FETS could be utilized, such as bipolar transistors. Thus, these and other modifications and additions may be obvious to those skilled in the art and may be implemented to adapt the present invention for use in a variety of different applications.

What is claimed is:

1. A digitally programmable gain normalization circuit electrically connected to a detector input circuit and a sample and hold circuit, the sample and hold circuit being operative to accumulate a charge representative of the output of the detector input circuit, the gain normalization circuit receiving counter and clock signals from external counter and clock circuitry and a GAIN signal from an external controller, said detector input circuit providing a current, the gain normalization circuit comprising:
   (a) a charge integrator having a capacitance, said charge integrator being electrically connected in parallel with the sample and hold circuit and electrically connected to the detector input circuit so as to cause a portion of the current received from the detector input circuit to accumulate as a charge within the charge integrator, the amount of charge accumulating within the charge integrator determining the gain of the gain normalization circuit; and
   (b) wherein the amount of charge accumulating within the charge integrator is proportional to the capacitance of the charge integrator and the capacitance of the charge integrator is externally controllable such that a desired gain may be achieved.

2. A digitally programmable gain normalization circuit as recited in claim 1 wherein said charge integrator comprises:
   (a) a plurality of selectable capacitors;
   (b) a plurality of transistors, each electrically connected in series with a dedicated one of said capacitors for electrically connecting any combination of said capacitors in parallel with each other to vary the capacitance of said charge integrator.

3. A gain normalization circuit as recited in claim 2 further comprising a static latch electrically connected in series with each of said transistors for selectively causing each of said transistors to conduct, thus adding the transistor's dedicated capacitor to said charge integrator.

4. A gain normalization circuit as recited in claim 2 further comprising a dynamic latch electrically connected in series with each of said transistors for selectively causing each of said transistors to conduct, thus adding the transistor's dedicated capacitor to said charge integrator.

5. A gain normalization circuit as recited in claim 3 wherein:
   (a) four static latches selectively cause four transistors to conduct, to electrically connect any combination of four capacitors in parallel in said charge integrator; and
   (b) wherein said four static latches are responsive to the counter signals and the GAIN signal, the counter signals defining all possible combinations of capacitors to be added to said charge integrator and the GAIN signal enabling said latches when the desired counter signals are applied to said latches, 6. A gain normalization circuit as recited in claim 4 wherein:
   (a) four dynamic latches selectively cause four transistors to conduct, to electrically connect any combination of four capacitors in parallel in said charge integrator; and
   (b) wherein said four static latches are responsive to counter signals and the GAIN signal, the counter signals defining all possible combinations of capacitors to be added to said charge integrator and the GAIN signal enabling said latches when the desired counter signals are applied to said latches.

7. A gain normalization circuit as recited in claim 5 wherein the values of said four capacitors are in approximately the ratios of C, C/2, C/4, and C/8.

8. A gain normalization circuit as recited in claim 6 wherein the values of said four capacitors are in approximately the ratios of C, C/2, C/4, and C/8.

9. A gain normalization circuit as recited in claim 5 wherein each of said static latches comprise:
   (a) a first invertor;
   (b) a second invertor electrically connected in series with and receiving the output of said first invertor, the output of said second invertor being fed back to the input of said first invertor; and
   (c) a transistor electrically connected in series with said first and said second invertors for applying one of the counter signals to said first invertor, said transistor being responsive to the GAIN signal.

10. A gain normalization circuit as recited in claim 6 wherein each of said dynamic latches comprise:
    (a) a capacitor; and
    (b) a transistor electrically connected in series with said capacitor, for applying one of the counter signals to said capacitor, said transistor being responsive to the GAIN signal.

11. A method for normalizing the gain of a detector/sample and hold circuit, operating in cooperation with a detector input circuit, the detector input circuit having an output, the detector/sample and hold circuit having a sample and hold circuit having a first capacitor upon which the detector signal can be stored, comprising the steps of:

(a) connected a charge integrator having a capacitance to the detector/sample and hold circuit so as to cause a portion of the output of the detector input circuit to accumulate within the charge integrator; and (b) selectively varying the portion of the charge accumulated with the charge integrator by varying the capacitance of the charge integrator to obtain the desired gain.

12. The method as recited in claim 11 wherein the step of selectively varying the capacitance of the charge integrator comprises:

(a) electrically connecting a combination of capacitors in parallel with the sample and hold circuit so as to vary the capacitance of the charge integrator such that the capacitance of the charge integrator defines the desired gain; and (b) wherein the step of connecting the capacitors in parallel with the sample and hold circuit is accomplished by the step of causing selected first transistors to conduct, each first transistor associated with a dedicated one of said capacitors, electrically connecting their associated dedicated capacitors in parallel with the first capacitor of the sample and hold circuit.

13. The method as recited in claim 12 wherein the step of causing the first transistors to conduct is by the communication of a signal to the first transistors using static latches.

14. The method as recited in claim 12 wherein the step of causing the first transistors to conduct is by communication of a signal to the first transistors using dynamic latches.

15. The method as recited in claim 13 wherein the step of causing the first transistors to conduct by using static latches further comprises the steps of:

(a) applying counter signals output from an external counter circuit to second transistors, the counter signals defining all possible combinations of capacitors to be added to the charge integrator, the second transistors being responsive to a GAIN signal output from an external controller, the GAIN signal enabling the latches when the desired counter signals are applied to the second transistors such that the correct first transistors will conduct and add their associated capacitors to the charge integrator to provide the desired gain;

(b) communicating the counter signals from the second transistors to first inverters; and (c) communicating the counter signals from the first inverters to second inverters, from which the counter signal is fed back to the input of the first inverters, thus maintaining the state of the first and second inverters, the output of the second inverters also being the input to the first transistors.

16. The method as recited in claim 14 as recited in claim 14 wherein the step of causing the first transistors to conduct by using dynamic latches further comprises the steps of:

(a) applying counter signals output from an external counter circuit to second transistors, the counter signals defining all possible combinations of capacitors to be added to the charge integrator, the second transistors being responsive to a GAIN signal output from an external controller, the GAIN signal enabling the latches when the desired counter signals are applied to the second transistors such that the correct first transistors will conduct and add their associated capacitors to the charge integrator to provide the desired gain; and (b) communicating the counter signals from the second transistors to capacitors, the signals stored on the capacitors being the input to the first transistors to cause each first transistor to conduct when a charge is placed upon the capacitor electrically connected to that first transistor.

* * * * *